(12) United States Patent
Strand

(10) Patent No.: US 11,545,288 B2
(45) Date of Patent: Jan. 3, 2023

(54) SUPERCONDUCTING CURRENT CONTROL SYSTEM

(71) Applicant: Joel D. Strand, Ellicott City, MD (US)

(72) Inventor: Joel D. Strand, Ellicott City, MD (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 302 days.

(21) Appl. No.: 16/849,595

(22) Filed: Apr. 15, 2020

(65) Prior Publication Data

US 2021/0327624 A1  Oct. 21, 2021

(51) Int. Cl.
| | | |
|---|---|---|
| *H01F 6/00* | (2006.01) | |
| *H01L 27/18* | (2006.01) | |
| *G06N 10/00* | (2022.01) | |
| *H01L 39/22* | (2006.01) | |
| *H01L 39/02* | (2006.01) | |

(52) U.S. Cl.
CPC .............. *H01F 6/008* (2013.01); *G06N 10/00* (2019.01); *H01L 27/18* (2013.01); *H01L 39/025* (2013.01); *H01L 39/223* (2013.01)

(58) Field of Classification Search
CPC ....... G06N 10/00; H01L 27/18; H01L 39/025; H01L 39/223
See application file for complete search history.

(56) References Cited

U.S. PATENT DOCUMENTS

| | | |
|---|---|---|
| 4,623,804 A | 11/1986 | Goto |
| 5,436,451 A | 7/1995 | Silver et al. |
| 5,936,458 A | 8/1999 | Rylov |
| 5,963,351 A | 10/1999 | Kaplounenko et al. |
| 6,157,329 A | 12/2000 | Lee et al. |
| 6,242,939 B1 | 6/2001 | Nagasawa et al. |
| 6,331,805 B1 | 12/2001 | Gupta et al. |

(Continued)

FOREIGN PATENT DOCUMENTS

| | | |
|---|---|---|
| EP | 0660126 A2 | 6/1995 |
| EP | 1213774 B1 | 12/2010 |

(Continued)

OTHER PUBLICATIONS

Invitation to Pay Fees for Application No. PCT/US2020/016622 dated Nov. 11, 2020.

(Continued)

*Primary Examiner* — Shaun M Campbell
(74) *Attorney, Agent, or Firm* — Tarolli, Sundheim, Covell & Tummino LLP

(57) ABSTRACT

One example includes a superconducting current control system. The system includes an inductive coupler comprising a load inductor and a control inductor. The inductive coupler can be configured to inductively provide a control current from the control inductor to a superconducting circuit device based on a load current being provided through the load inductor. The system also includes a current control element comprising a superconducting quantum interference device (SQUID) array comprising a plurality of SQUIDs. The current control element can be coupled to the inductive coupler to control an amplitude of the load current through the load inductor, and thus to control an amplitude of the control current to the superconducting circuit device.

13 Claims, 3 Drawing Sheets

(56) References Cited

U.S. PATENT DOCUMENTS

| | | | |
|---|---|---|---|
| 6,653,962 | B2 | 11/2003 | Gupta et al. |
| 6,815,708 | B1 | 11/2004 | Iguchi et al. |
| 6,864,005 | B2 | 3/2005 | Mossman |
| 7,095,227 | B2 | 8/2006 | Tarutani et al. |
| 7,227,480 | B2 | 6/2007 | Furuta et al. |
| 7,598,897 | B2 | 10/2009 | Kirichenko |
| 7,630,588 | B2 | 12/2009 | Ouchi |
| 7,689,070 | B2 | 3/2010 | Ouchi |
| 7,724,020 | B2 | 5/2010 | Herr |
| 7,724,083 | B2 | 5/2010 | Herr et al. |
| 7,772,871 | B2 | 8/2010 | Herr et al. |
| 7,782,077 | B2 | 8/2010 | Herr et al. |
| 7,786,748 | B1 | 8/2010 | Herr |
| 7,889,992 | B1 | 2/2011 | Divincenzo et al. |
| 8,188,901 | B1 | 5/2012 | Inamdar et al. |
| 8,670,807 | B2 | 3/2014 | Rose et al. |
| 8,849,075 | B2 | 9/2014 | Painter et al. |
| 8,952,671 | B2 | 2/2015 | Shimizu et al. |
| 9,097,751 | B1 | 8/2015 | Longhini et al. |
| 9,174,840 | B2 | 11/2015 | Herr et al. |
| 9,312,878 | B1 | 4/2016 | Inamdar et al. |
| 9,438,246 | B1 * | 9/2016 | Naaman .............. G06N 10/00 |
| 9,443,576 | B1 | 9/2016 | Miller |
| 9,455,707 | B2 | 9/2016 | Herr et al. |
| 9,467,126 | B1 | 10/2016 | Naaman et al. |
| 9,497,126 | B2 | 11/2016 | Matsuhira |
| 9,595,970 | B1 | 3/2017 | Reohr et al. |
| 9,613,699 | B1 | 4/2017 | Reohr et al. |
| 9,646,682 | B1 | 5/2017 | Miller et al. |
| 9,779,803 | B1 | 10/2017 | Konigsburg et al. |
| 9,780,765 | B2 | 10/2017 | Naaman et al. |
| 9,787,312 | B2 | 10/2017 | Herr et al. |
| 9,853,645 | B1 | 12/2017 | Mukhanov et al. |
| 9,876,505 | B1 | 1/2018 | Dai et al. |
| 9,887,700 | B2 | 2/2018 | Carmean et al. |
| 10,090,841 | B1 | 10/2018 | Herr |
| 10,491,178 | B2 | 11/2019 | Naaman et al. |
| 2001/0025012 | A1 | 9/2001 | Tarutani et al. |
| 2004/0201099 | A1 | 10/2004 | Herr |
| 2004/0201400 | A1 | 10/2004 | Herr |
| 2005/0047245 | A1 | 3/2005 | Furuta et al. |
| 2005/0078022 | A1 | 4/2005 | Hirano et al. |
| 2005/0231196 | A1 | 10/2005 | Tarutani et al. |
| 2006/0049891 | A1 | 3/2006 | Crete |
| 2006/0085160 | A1 | 4/2006 | Ouchi |
| 2006/0209413 | A1 | 9/2006 | Kim et al. |
| 2006/0255987 | A1 | 11/2006 | Nagasawa et al. |
| 2008/0049885 | A1 | 2/2008 | Inamdar |
| 2008/0267557 | A1 | 10/2008 | Wang et al. |
| 2008/0304038 | A1 | 12/2008 | Ouchi |
| 2009/0002014 | A1 | 1/2009 | Gupta et al. |
| 2009/0075825 | A1 | 3/2009 | Rose et al. |
| 2009/0082209 | A1 * | 3/2009 | Bunyk .............. G06N 10/00 341/145 |
| 2010/0026537 | A1 | 2/2010 | Kirichenko |
| 2010/0033252 | A1 | 2/2010 | Herr et al. |
| 2012/0274494 | A1 | 11/2012 | Kirichenko |
| 2013/0121633 | A1 | 5/2013 | Painter et al. |
| 2013/0278283 | A1 * | 10/2013 | Berkley .............. G06N 10/00 326/5 |
| 2014/0229722 | A1 * | 8/2014 | Harris .............. B82Y 10/00 713/1 |
| 2015/0060650 | A1 | 3/2015 | Park |
| 2015/0060756 | A1 | 3/2015 | Park |
| 2015/0092465 | A1 | 4/2015 | Herr et al. |
| 2015/0094207 | A1 | 4/2015 | Herr et al. |
| 2015/0349780 | A1 | 12/2015 | Naaman et al. |
| 2016/0013791 | A1 | 1/2016 | Herr et al. |
| 2016/0079968 | A1 | 3/2016 | Strand et al. |
| 2016/0164505 | A1 | 6/2016 | Naaman et al. |
| 2017/0017742 | A1 | 1/2017 | Oberg et al. |
| 2018/0145664 | A1 | 5/2018 | Herr et al. |
| 2019/0131944 | A1 * | 5/2019 | Naaman .............. H03F 19/00 |
| 2021/0234086 | A1 * | 7/2021 | Lescanne .............. H01L 39/223 |

FOREIGN PATENT DOCUMENTS

| | | |
|---|---|---|
| JP | 2013058998 A | 3/2013 |
| WO | 98/08307 A1 | 2/1998 |
| WO | 2009/023969 A1 | 2/2009 |
| WO | 2011/032825 A1 | 3/2011 |
| WO | 2014/028302 A2 | 2/2014 |
| WO | 2017/204977 A1 | 11/2017 |
| WO | 2018/044563 A1 | 3/2018 |

OTHER PUBLICATIONS

Mukhanov, et al. "Superconductor Analog-to-Digital Converters" Proceedings of the IEEE, IEEE. New York, Us, vol. 92, No. 10, Oct. 1, 2004, pp. 1564-1584, XP011118881, ISSN: 0018-9219, DOI: 10.1109/JPROC.2004.833660, figure 8.

Herr, et al.: "Ultra-Low-Power Superconductor Logic"; Journal of Applied Physics 109, 103903 (2011); Published Online: May 2011; https://doi.org/10.1063/1.3585849.

Herr: "A High-Efficiency Superconductor Distributed Amplifier"; Published Jan. 21, 2010 • IOP Publishing Ltd; Superconductor Science and Technology, vol. 23, No. 2.

Bochman, et al., "Nanomechanical Coupling between Microwave and Optical Photons", Nature Physics, vol. 9, No. 11, pp. 712-716 (2013), DOI: 10.1038/nphys2748.

Favero, et al., "Optomechanics of Deformable Optical Cavities", Nature Photonics, vol. 3, No. 4, pp. 201-205 (2009), DOI: 10.1038/nphoton.2009.42.

Teufel, et al. , "Prospects for Cooling Nanomechanical Motion by Coupling to a Superconducting Microwave Resonator", New Journal of Physicans, vol. 10, No. 9, pp. 095002 (2008), DOI: 10.1088/1367-2630/10/9/095002.

Aspelmeyer, et al., "Cavity Optomechanics", Rev. Mod. Phys., vol. 86, No. 4, pp. 1391-1452 (2013), DOI: 10.113/RevModPhys.86.1391.

Tallur, et al., "Rayleigh Scattering Boosted Multi-GHz Displacement Sensitivity in Whispering Gallery Opto-Mechanical Resonators", Opt. Express 21, 27780-27788 (2013).

Tao, et al., "A Novel Transducer for Photon Energy Detection Via Near-Field Cavity Optomechanics", in Solid-State Sensors, Actuators and Microsystems (Transducers & Eurosensors XXVII), 2013 Transducers & Eurosensors XXVII: The 17th International Conference on , vol. no., pp. 1511-1514, 16-20 (2013) DOI: 10.1109/Transducers.2013.6627068.

Stannigel, et al., "Opto-Mechanical Transducers for Long-Distance Quantum Communication", Jun. 22, 2010, DOI: 10.1103/PhysRevLett.105.220501.

Aoki, et al.: "Observation of Strong Coupling Between One Atom and a Monolithic Microresonator", Norman Bridge Laboratory of Physics 12-33, California Institute of Technology, Pasadena, CA 91125, USA, Sep. 4, 2006, pp. 1-12.

Dicarlo, et al.: "Demonstration of Two-Qubit Algorithms with a Superconducting Quantum Processor", Departments of Physics and Applied Physics, Yale University, New Haven, CT 06511, USA, May 1, 2009, pp. 1-6 & Supplemental Material pp. 1-3.

Eichenfield, et al.: "Optomechanical Crystals", California Institute of Technology, Pasadena, CA 91125, USA, Jun. 6, 2009, pp. 1-16.

Hossein-Zadeh, et al: "An Optomechanical Oscillator on a Silicon Chip", IEEE Journal of Selected Topics in Quantum Electronics, vol. 16, No. 1, Jan./Feb. 2010, pp. 276-287.

Kimble: "The Quantum Internet", Norman Bridge Laboratory of Physics 12-33, Jun. 25, 2006, pp. 1-15.

Lin, et al.: "Coherent Mixing of Mechanical Excitations in Nano-Optomechanical Structures", Laboratory of Applied Physics, California Institute of Technology, Pasadena, CA 91125, USA, Aug. 7, 2009, pp. 1-27.

O'Connell, et al.: "Quantum Ground State and Single-Phonon Control of a Mechanical Resonator", Nature, Articles, vol. 464, Apr. 1, 2010, pp. 697-703.

Regal, et al.: "From Cavity Electromechanics to Cavity Optomechanics", 22nd International Conference on Atomic Physics, Journal of Physics: Conference Series 264 (2011) 012025, pp. 1-8.

(56) References Cited

OTHER PUBLICATIONS

Safavi-Naeini, et al.: "Proposal for an Optomechanical Traveling Wave Phonon-Photon Translator", New Journal of Physics 13 (2011) 013017 (30pp), Received Oct. 1, 2010, Published Jan. 13, 2011, Online at http://www.njp.org, pp. 1-30.

Sillanpää, et al.: "Coherent Quantum State Storage and Transfer Between Two Phase Dubits Via a Resonant Cavity ", National Institute of Standards and Technology, 325 Broadway, Boulder, CO 80305, USA, Sep. 14, 2007, pp. 1-17.

Teufel, et al.: "Circuit Cavity Electromechanics in the Strong-Coupling Regime", Letter, Nature, vol. 471, Mar. 10, 2011, pp. 204-208.

André, et al. : "A Coherent All-Electrical Interface Between Polar Molecules and Mesoscopic Superconducting Resonators"; Nature Physics, vol. 2, No. 9, Aug. 27, 2006, pp. 636-642; XP055174009, ISSN: 1745-2473; DOI: 10.1038/nphys386.

Winger et al.: "A chip-scale integrated cavity-electro-optomechanics platform", Optics Express, vol. 19, No. 25, Nov. 22, 2011 (Nov. 22, 2011), pp. 24905-24921, XP002732657.

Sun et al: "A superhigh-frequency optoelectromechanical system based on a slotted photonic crystal cavity", Applied Physics Letters, American Institute of Physics, US, vol. 101, No. 22. Nov. 26, 2012 (Nov. 26, 2012), pp. 221116-221116, XP012168118, ISSN: 0003-6951, DOI: 10.1063/1.4769045.

Painter: Optomechanical crystals Photonics Conference (IPC), 2012 IEEE, IEEE, Sep. 23, 2012 (Sep. 23, 2012), p. 546, XP032269201, DOI: 10.1109/IPCON.2012.6358735 ISBN: 978-1-4577-0731-5.

Mukhanov O A et al.: "Development of Energy-efficient Cryogenic Optical (ECO) data link", 2013 IEEE 14th International Superconductive Electronics Conference (ISEC). IEEE, Jul. 7, 2013 (Jul. 7, 2013), pp. 1-3, XP032485120, DOI: 10.1109/ISEC.2013.6604276.

Cicak et al: "Vacuum-Gap Capacitors for Low-Loss Superconducting Resonant Circuits", IEEE Transactions on Applied Superconductivity, IEEE Service Center, Los Alamitos, CA, US, vol. 19, No. 3, Jun. 1, 2009 (Jun. 1, 2009), pp. 948-952, XP011262430, ISSN: 1051-8223.

CST AG Nanophotonics and integrated optics, "Photonic Crystal Cavities" (2013).

Google search results on "optical cavity nanophotonic crystal" Sep. 29, 2015.

International Search Report dated Jan. 5, 2022 for corresponding PCT/US2021/021947.

* cited by examiner

SUPERCONDUCTING CURRENT CONTROL SYSTEM

GOVERNMENT INTEREST

The invention was made under Government Contract. Therefore, the US Government has rights to the invention as specified in that contract.

TECHNICAL FIELD

This disclosure relates generally to classical and superconducting computing systems, and more specifically to a superconducting current control system.

BACKGROUND

In a variety of different types of superconducting circuits, control loops are typically implemented to provide operational power to a given circuit via dynamic flux. The flux control can be delivered via a current flowing through a load inductor that is coupled to a current loop that includes a given superconducting circuit. The load inductor can be coupled to the current loop via an inductive coupling that implements a mutual inductance. To provide a sufficient amount of current to the superconducting circuit, a superconducting converter (DAC) can be coupled to the load inductor to tune the current amplitude to the superconducting circuit. The DAC can thus be adjusted during a calibration process to provide the sufficient amplitude of the current to the superconducting circuit.

SUMMARY

One example includes a superconducting current control system. The system includes an inductive coupler comprising a load inductor and a control inductor. The inductive coupler can be configured to inductively provide a control current from the control inductor to a superconducting circuit device based on a load current being provided through the load inductor. The system also includes a current control element comprising a superconducting quantum interference device (SQUID) array comprising a plurality of SQUIDs. The current control element can be coupled to the inductive coupler to control an amplitude of the load current through the load inductor, and thus to control an amplitude of the control current to the superconducting circuit device.

Another example includes a method for controlling an amplitude of a control current provided to a superconducting circuit device. The method includes coupling the superconducting circuit device to a current control element via an inductive coupler. The current control element includes a SQUID array comprising a plurality of radio frequency (RF) SQUIDs. The method also includes providing an input current to the current control element and a load current associated with the inductive coupler to inductively provide the control current from a control inductor associated with the inductive coupler. The method further includes providing a bias current to the current control element to control an amplitude of the load current through the load inductor based on an amplitude of the bias current.

Another example includes a superconducting current control system. The system includes an inductive coupler comprising a load inductor and a control inductor. The inductive coupler can be configured to inductively provide a control current from the control inductor to a superconducting circuit device based on a load current being provided through the load inductor as a portion of an input current that is received at an input of the superconducting current control system. The system further includes a current control element comprising a first SQUID array and a second SQUID array arranged in parallel between a first terminal and a second terminal. Each of the first and second SQUID array includes a plurality of RF SQUIDs. The current control element can be coupled to the inductive coupler via at least one of the first and second terminals to control an amplitude of the load current through the load inductor based on an amplitude of a bias current provided to the current control element. The control current can have an amplitude that is based on the amplitude of the load current.

DETAILED DESCRIPTION

This disclosure relates generally to classical and superconducting computing systems, and more specifically to a superconducting current control system. The current control system can be implemented in any of a variety of classical and/or superconducting computer systems that may require providing a control current to a superconducting circuit device, such as to tune the control current to a sufficient optimal amplitude. For example, the superconducting current control system can be implemented to tune the amplitude of the control current to the sufficient optimal amplitude during calibration of the superconducting circuit device. The superconducting current control system can include an inductive coupler that includes a load inductor and a control inductor arranged with a mutual inductance with respect to each other. The load inductor can be configured to conduct a load current that is a portion of an input current provided to the superconducting current control system, thus inductively providing the control current via the control inductor to the superconducting circuit device. The control current therefore has an amplitude that is controlled based on an amplitude of the load current.

The superconducting current control system further includes a current control element that is coupled to the load inductor of the inductive coupler. The current control element can include an array of superconducting quantum interference devices (SQUIDs), such as radio frequency (RF) SQUIDs, arranged to conduct a portion of the input current to control the amplitude of the load current. The current control element can also receive a bias current that has an amplitude that can control an amount of flux of the SQUID array to control an inductance of the current control element. For example, the current control element can be arranged in parallel with the load inductor to conduct a first portion of the input current, such that the load inductor conducts a second portion of the input current. As another example, the current control element can be arranged in series with the load inductor, with a shunt inductor being arranged in parallel with the series connection of the load inductor and the current control element, such that the current control element and the load inductor conduct a first portion of the input current and the shunt inductor can conduct the second portion of the input current.

Figure 1:
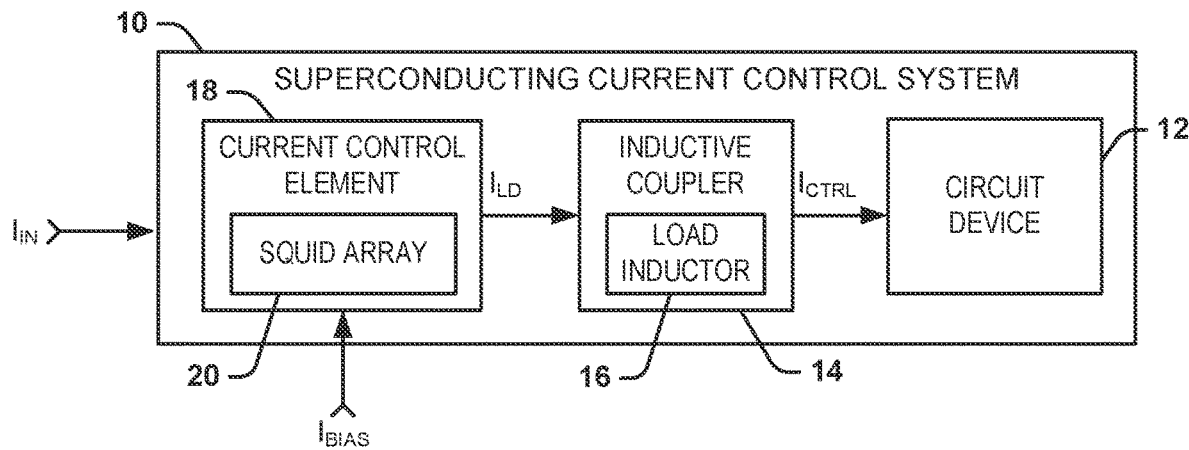
FIG. 1 illustrates an example of a superconducting current control system.

FIG. 1 illustrates an example of a superconducting current control system 10. The superconducting current control system 10 can be implemented in any of a variety of classical and superconducting computer systems that may require providing a control current $I_{CTRL}$ to a superconducting circuit device 12, such as during calibration of the superconducting circuit device 12.

In the example of FIG. 1, the superconducting current control system 10 receives an input current $I_{IN}$ that can have a static current amplitude. The superconducting current control system 10 includes an inductive coupler 14 that can include a load inductor 16 and a control inductor arranged with a mutual inductance with respect to each other. The load inductor 16 can be configured to conduct a load current $I_{LD}$ that is a portion of the input current $I_{IN}$ provided to the superconducting current control system 10. As a result, the inductive coupler 14 can provide the control current $I_{CTRL}$ via the associated control inductor to the superconducting circuit device 12. The control current $I_{CTRL}$ therefore has an amplitude that is controlled based on an amplitude of the load current $I_{LD}$.

The superconducting current control system 10 further includes a current control element 18. The current control element 18 can include an array of superconducting quantum interference devices (SQUIDs) 20, such as radio frequency (RF) SQUIDs, arranged to conduct a portion of the input current $I_{IN}$ to control the amplitude of the load current $I_{LD}$. For example, the current control element 18 can be coupled to the load inductor 16, such that an inductance of the current control element 18 can be controlled to divert a portion of the input current $I_{IN}$ through the load inductor 16. In the example of FIG. 1, the current control element 18 receives a bias current $I_{BIAS}$ that has an amplitude that can control an amount of flux of the SQUID array 20 of the current control element 18, such as to control the inductance of the current control element 18. As described in greater detail herein, the current control element 18 can be arranged in parallel with or in series with the load inductor 16. Therefore, the load inductor 16 can conduct a portion of the input current $I_{IN}$ having an amplitude that can correspond to the amplitude of the control current provided to the superconducting circuit device 12.

As an example, the SQUID array 20 can include a plurality of RF superconducting quantum interference devices (SQUIDs) that are arranged in an alternating arrangement along an array. Each of the RF SQUIDs can include a Josephson junction and a pair of inductors that form an inductive path of a portion of the input current $I_{IN}$ that is controlled by the bias current $I_{BIAS}$ to control an amplitude of the load current $I_{LD}$. For example, the arrangement of the RF SQUIDs in the SQUID array 20 can include two inductive paths in parallel, such that the SQUID array 20 can include two RF SQUID arrays provided in parallel between respective terminals of the current control element 18.

Figure 2:
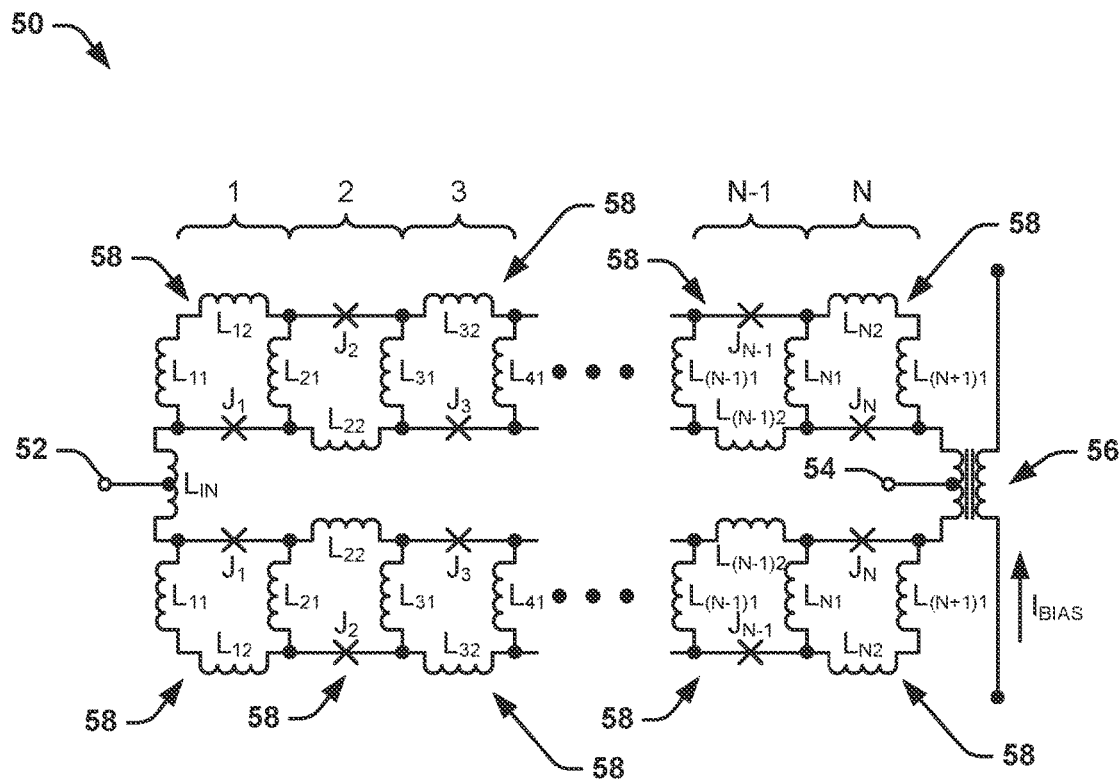
FIG. 2 illustrates an example of a superconducting quantum interference device (SQUID) array.

FIG. 2 illustrates an example of a current control element 50. The current control element 50 can correspond to the current control element 18 in the example of FIG. 1. Therefore, reference is to be made to the example of FIG. 1 in the following description of the example of FIG. 2.

The current control element 50 includes a first terminal 52 and a second terminal 54. As an example, at least one of the first and second terminals 52 and 54 can be coupled to the inductive coupler 14 in the example of FIG. 1. The first terminal 52 is coupled to an input inductor $L_{IN}$ in a manner that the input inductor $L_{IN}$ is split between each of two SQUID arrays of the current control element 50, as described in greater detail herein. The second terminal 54 is coupled to a secondary winding of a transformer 56, with the primary winding of the transformer 56 being configured to conduct the bias current $I_{BIAS}$. In addition, the current control element 50 includes a plurality 2×N of RF SQUIDs 58, with the arrangement of RF SQUIDs 58 being arranged in two parallel alternating array sequences of the N RF SQUIDs 58 between the first and second terminals 52 and 54. Thus, the two N-sequence arrays of RF SQUIDs 58 are demonstrated as mirror-images with respect to each other between the first and second terminals 52 and 54. As an example, the quantity of N can be selected to balance increased inductance of the current path through the current control element 50 for higher quantities of N relative to spatial considerations.

Each of the RF SQUIDs 58 includes a pair of inductors and a Josephson junction. In each of the two N-sequence arrays of RF SQUIDs 58, the inductors are labeled $L_{X1}$ and $L_{X2}$, with X corresponding to the number of the respective RF SQUID 58 along the respective array of the RF SQUIDs 58. Similarly, in each of the two N-sequence arrays of RF SQUIDs 58, the Josephson junctions are labeled $J_X$. As an example, all of the Josephson junctions $J_X$ can have an approximately equal critical current $I_C$. In the example of FIG. 2, the first inductor $L_{X1}$ of each of the RF SQUIDs 58, with the exception of $L_{11}$, is common to a preceding RF SQUID 58 in the sequence of RF SQUIDs 58. Additionally, the Nth RF SQUID 58 includes an additional inductor $L_{(N+1)1}$ that is coupled to the secondary winding of the transformer 56. As described herein, in the example of FIG. 2, the inductors $L_{X1}$ and $L_{X2}$ of the RF SQUIDs 58 form a pair of inductive paths for a portion of the input current $L_{IN}$ between the first and second terminals 52 and 54, with each of the inductive paths being provided through the inductors $L_{X1}$ and $L_{X2}$ in parallel with each of the respective Josephson junctions $J_X$. As described in greater detail herein, the flux of each of the RF SQUIDs 58 can be controlled via the bias current $I_{BIAS}$ to provide a controlled variable inductance between the first and second terminals 52 and 54.

As described previously, the current control element 50 is demonstrated as being formed as two arrays of RF SQUIDs, with each of the N stages of each of the arrays being composed of a Josephson junction $J_X$ having a critical current $I_C$ shunted by the respective linear inductors $L_{X1}$ and $L_{X2}$. Therefore, the inductance of the two arrays in parallel, and the flux derivative $L'_T(\Phi_{ax})$, can be expressed as:

$$L_T(\delta_0(\Phi_{dc})) = \frac{N}{2} \frac{(L_1+L_2)L_J + L_1 L_2 \cos\delta_0}{L_J + (4L_1 + L_2)\cos\delta_0} \quad \text{Equation 1}$$

$$L'_T(\delta_0(\Phi_{dc})) = \frac{(2L_1+L_2)^3 L_J^2 \pi \sin\delta_0}{2\Phi_0[(L_1+L_2)L_J + L_1 L_2 \cos\delta_0]} \quad \text{Equation 2}$$

$$[L_J + (4L_1+L_2)\cos\delta_0]^2$$

$$L_J = \hbar/2eI_c \quad \text{Equation 3}$$

Where: $\Phi_0$ is a flux quantum, and $\delta_0(\Phi_{dc})$ can be expressed as:

$$\left(\frac{1}{L_1} + \frac{1}{L_2}\right)\delta_0 + \frac{1}{L_J}\sin\delta_0 = \frac{\pi\Phi_{dc}}{N\Phi_0}\left(\frac{1}{L_1} + \frac{2}{L_2}\right) \quad \text{Equation 4}$$

Therefore, Equations 1-4 demonstrate how the inductance of the current control element 50 can be controlled by the bias current $I_{BIAS}$ to provide an inductive current path for a portion of the input current $I_{IN}$.

As a result of the arrangement of the current control element 50, the current control element 50 can be implemented to set the current amplitude of the load current $I_{LD}$ through the load inductor 16 to set the amplitude of the control current $I_{CTRL}$ that is inductively provided to the superconducting circuit device 12 via the inductive coupler 14. Because of the arrangement of the array of RF SQUIDs 58 in the current control element 50, the ratio $\beta_L$ of the load inductance of the load inductor 16 to the Josephson inductance of the Josephson junctions $J_X$ can be less than one. Therefore, the current control element 50 can operate to control the amplitude of the load current $I_{LD}$, and thus the control current $I_{CTRL}$, without exhibiting hysteretic behavior, as opposed to typical current control methods that implement a simple SQUID to provide an inductive current path for the input current $I_{IN}$. Accordingly, the current control element 50 can operate with a significantly higher dynamic range relative to typical current control methods that implement a single SQUID.

Figure 3:
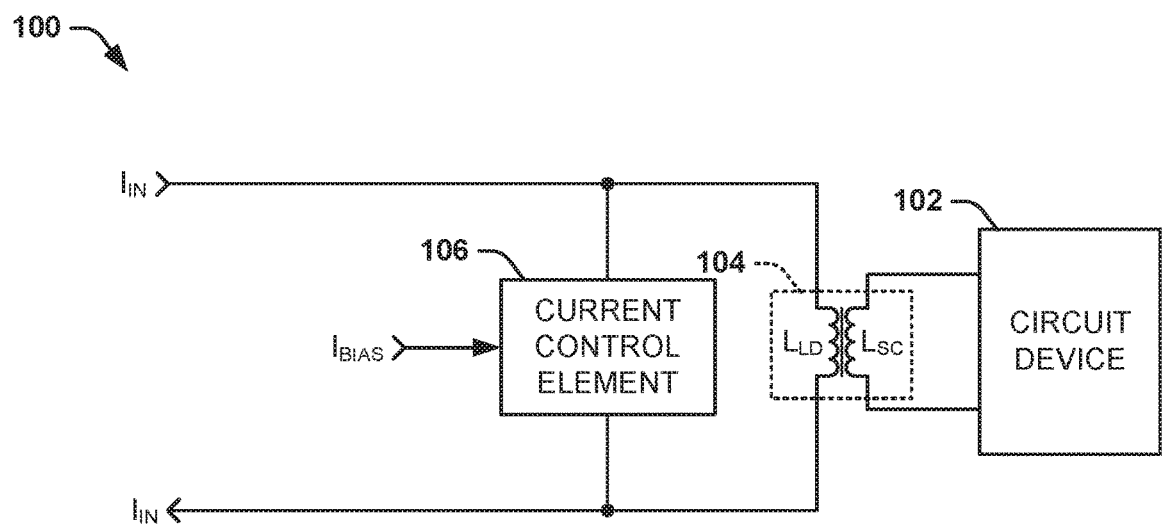
FIG. 3 illustrates another example of a superconducting current control system.

FIG. 3 illustrates an example of a superconducting current control system 100. The superconducting current control system 100 can be implemented in any of a variety of classical and superconducting computer systems that may require providing a control current $I_{CTRL}$ to a superconducting circuit device 102, such as during calibration of the superconducting circuit device 102.

In the example of FIG. 3, the superconducting current control system 100 receives an input current $I_{IN}$ that can have a static current amplitude. The superconducting current control system 100 includes an inductive coupler 104, demonstrated in the example of FIG. 3 as a transformer includes a load inductor $L_{LD}$ and a control inductor $L_{CTRL}$ arranged with a mutual inductance with respect to each other. The superconducting current control system 100 also includes a current control element 106 that is demonstrated in the example of FIG. 3 as being arranged in parallel with the load inductor $L_{LD}$. Therefore, the current control element 106 is configured to conduct a current $I_{CC}$ that corresponds to a first portion of the input current $I_{IN}$ and the load inductor $L_{LD}$ is configured to conduct a load current $I_{LD}$ that is a second portion of the input current $I_{IN}$ (e.g., such that the sum of the current $I_{CC}$ and the load current $I_{LD}$ is approximately equal to the input current $I_{IN}$). As a result, the control inductor $L_{CTRL}$ can provide the control current $I_{CTRL}$ to the superconducting circuit device 102 based on an amplitude of the load current $I_{LD}$.

As an example, the current control element 106 can correspond to the current control element 50 in the example of FIG. 2. Therefore, the current control element 106 can be arranged such that the opposite ends of the load inductor $L_{LD}$ can be coupled to the respective terminals 52 and 54 to provide the parallel arrangement between the current control element 106 and the load inductor $L_{LD}$. Similar to as described previously, the current control element 106 includes an array of RF SQUIDs arranged to conduct the current $I_{CC}$ to control the amplitude of the load current $I_{LD}$. In the example of FIG. 3, the current control element 106 receives the bias current $I_{BIAS}$ that has an amplitude that can control an amount of flux of the RF SQUID array of the current control element 106, such as to control the inductance of the current control element 106. Therefore, the load inductor $L_{LD}$ can conduct the load current $I_{LD}$ having an amplitude that can correspond to the amplitude of the control current $I_{CTRL}$ provided to the superconducting circuit device 102. For example, when the current control element 106 is unbiased (e.g., the bias current $I_{BIAS}$ having an approximately zero amplitude), the current control element 106 can divert approximately half the input current $I_{IN}$ from the load inductor $L_{LD}$, and can divert approximately zero input current $I_{IN}$ from the load inductor $L_{LD}$ when approximately maximally biased. Therefore, the current control element 106 can provide a dynamic range of approximately twice the load current $I_{LD}$ between the approximate zero and the approximate full bias conditions.

Figure 4:
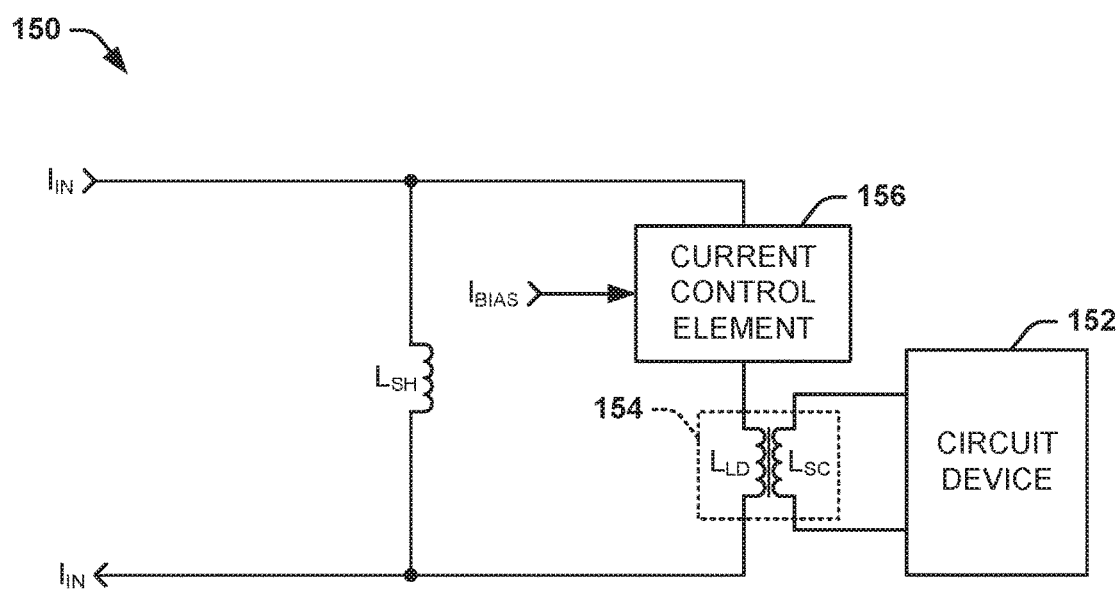
FIG. 4 illustrates yet another example of a superconducting current control system.

FIG. 4 illustrates an example of a superconducting current control system 150. The superconducting current control system 150 can be implemented in any of a variety of classical and superconducting computer systems that may require providing a control current $I_{CTRL}$ to a superconducting circuit device 152, such as during calibration of the superconducting circuit device 152.

In the example of FIG. 4, the superconducting current control system 150 receives an input current $I_{IN}$ that can have a static current amplitude. The superconducting current control system 150 includes an inductive coupler 154, demonstrated in the example of FIG. 4 as a transformer includes a load inductor $L_{LD}$ and a control inductor $L_{CTRL}$ arranged with a mutual inductance with respect to each other. The superconducting current control system 150 also includes a current control element 156 that is demonstrated in the example of FIG. 4 as being arranged in series with the load inductor $L_{LD}$. The superconducting current control system 150 further includes a shunt inductor $L_{SH}$ that is arranged in parallel with the series arrangement of the current control element 156 and the load inductor $L_{LD}$. Therefore, the shunt inductor $L_{SH}$ is configured to conduct a current $I_{CC}$ that corresponds to a first portion of the input current $I_{IN}$, and the series arrangement of the current control element 156 and the load inductor $L_{LD}$ is configured to conduct a load current $I_{LD}$ that is a second portion of the input current $I_{IN}$ (e.g., such that the sum of the current $I_{CC}$ and the load current $I_{LD}$ is approximately equal to the input current $I_{IN}$). As a result, the control inductor $L_{CTRL}$ can provide the control current $I_{CTRL}$ to the superconducting circuit device 152 based on an amplitude of the load current $I_{LD}$.

As an example, the current control element 156 can correspond to the current control element 50 in the example of FIG. 2. Therefore, the current control element 156 can be arranged such that the load inductor $L_{LD}$ is coupled to one of the terminals 52 and 54 to provide the series arrangement of the current control element 156 and the load inductor $L_{LD}$. Similar to as described previously, the current control element 156 includes an array of RF SQUIDs arranged to conduct the load current $I_{LD}$. In the example of FIG. 4, the current control element 156 receives the bias current $I_{BIAS}$ that has an amplitude that can control an amount of flux of the RF SQUID array of the current control element 156, such as to control the inductance of the current control element 156. Therefore, the current control element 156 and the load inductor $L_{LD}$ can conduct the load current $I_{LD}$ having an amplitude that can correspond to the amplitude of the control current $I_{CTRL}$ provided to the superconducting circuit device 152. For example, when the current control element 156 is unbiased (e.g., the bias current $I_{BIAS}$ having an approximately zero amplitude), the current control element 156 and load inductor $L_{LD}$ can conduct approximately half the input current $I_{IN}$ as the load inductor $L_{LD}$, and can conduct approximately zero amplitude (e.g., approximately 0.025 amps) of the input current $I_{IN}$ as the load inductor $L_{LD}$ when approximately maximally biased. Therefore, the current control element 156 can provide a dynamic range of approximately twenty times the load current $I_{LD}$ between the approximate zero and the approximate full bias conditions.

Figure 5:
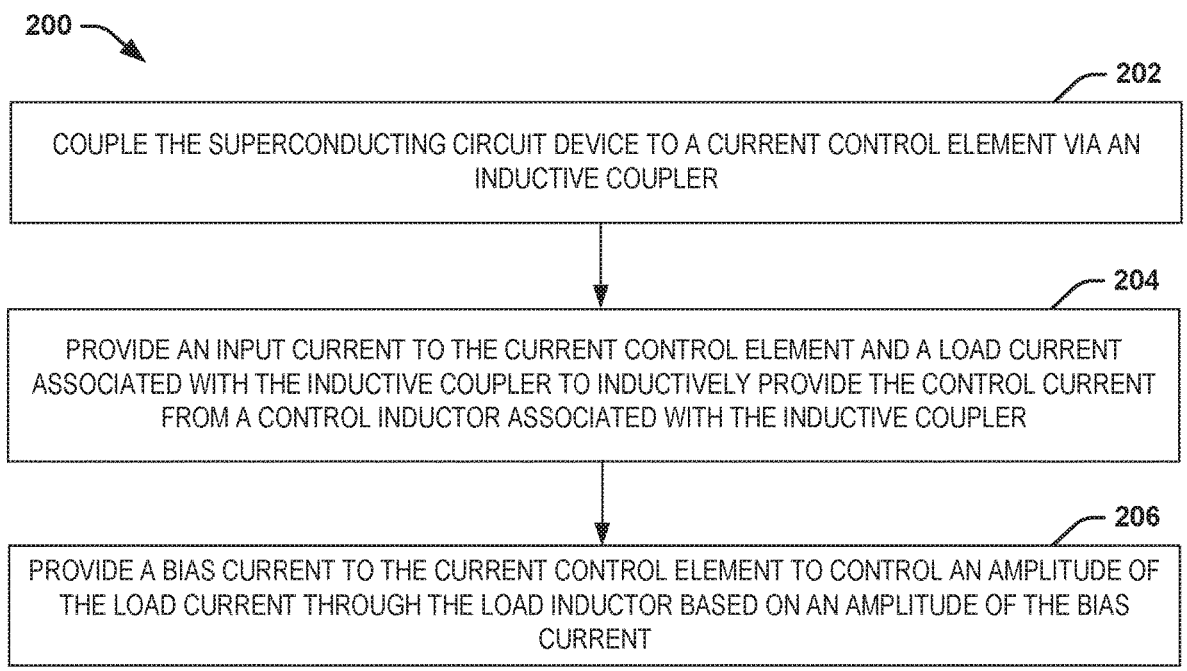
FIG. 5 illustrates an example of a method for controlling an amplitude of a control current provided to a superconducting circuit device.

In view of the foregoing structural and functional features described above, a methodology in accordance with various aspects of the disclosure will be better appreciated with reference to FIG. 5. FIG. 5 illustrates an example of a method 200 for controlling an amplitude of a control current provided to a superconducting circuit device. It is to be understood and appreciated that the method of FIG. 5 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

At 202, the superconducting circuit device (e.g., the superconducting circuit device 12) is coupled to a current control element (e.g., the current control element 18) via an inductive coupler (e.g., the inductive coupler 14), the current control element comprising a SQUID array (e.g., the SQUID array 20) comprising a plurality of RF SQUIDs (e.g., the SQUIDs 58). At 204, an input current (e.g., the input current $I_{IN}$) is provided to the current control element and a load current (e.g., the load current $I_{LD}$) associated with the inductive coupler to inductively provide the control current (e.g., the control current $I_{CTRL}$) from a control inductor (e.g., the control inductor $L_{CTRL}$) associated with the inductive coupler. At 206, a bias current (e.g., the bias current $I_{BIAS}$) is provided to the current control element to control an amplitude of the load current through the load inductor based on an amplitude of the bias current.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting current control system comprising:
    an inductive coupler comprising a load inductor and a control inductor, the inductive coupler being configured to inductively provide a control current from the control inductor to a superconducting circuit device based on a first portion of an input current that is received at an input of the superconducting current control system as a load current being provided through the load inductor; and
    a current control element arranged in parallel with the load inductor and comprising a superconducting quantum interference device (SQUID) array comprising a plurality of SQUIDs, the current control element being configured as a tunable inductive path for a second portion of the input current to control an amplitude of the first portion of the input current as the load current through the load inductor, and thus to control an amplitude of the control current to the superconducting circuit device.

2. The system of claim 1, wherein the plurality of SQUIDs are arranged as a plurality of radio frequency (RF) SQUIDs arranged in an array between a first terminal of the SQUID array and a second terminal of the SQUID array, wherein at least one of the first and second terminals is conductively coupled to the inductive coupler.

3. The system of claim 2, wherein the array of RF SQUIDs is arranged as a first array of RF SQUIDs and a second array of RF SQUIDs arranged in parallel between the first and second terminals of the SQUID array.

4. The system of claim 1, wherein each of the plurality of SQUIDs comprises a Josephson junction and an inductor opposite the Josephson junction, wherein the SQUIDs are arranged in an alternating pattern with respect to the respective Josephson junction and the respective inductor.

5. The system of claim 4, wherein the inductor associated with each of the SQUIDs is a first inductor, each of the SQUIDs comprising a second inductor, the second inductor interconnecting the respective one of the SQUIDs and a previous one of the SQUIDs in the array to provide flux to the respective one of the SQUIDs and the previous one of the SQUIDs in response to an input current, the load current being a portion of the input current.

6. The system of claim 1, wherein the current control element is configured to receive a bias current to control the amplitude of the load current through the load inductor based on an amplitude of the bias current.

7. The system of claim 6, wherein the current control element comprises a transformer configured to receive the bias current to induce a flux in each of the SQUIDs of the SQUID array.

8. A method for controlling an amplitude of a control current provided to a superconducting circuit device, the method comprising:
    coupling the superconducting circuit device to a current control element via an inductive coupler, the inductive coupler comprising a load inductor and a control inductor, the current control element being arranged in parallel with the load inductor and comprising a superconducting quantum interference device (SQUID) array comprising a plurality of radio frequency (RF) SQUIDs;
    providing a first portion of an input current to the current control element and a second portion of the input current as a load current to the load inductor to inductively provide the control current from the control inductor; and
    providing a bias current to the current control element to provide a tunable inductive path for the first portion of the input current to control an amplitude of the second portion of the input current as the load current through the load inductor based on an amplitude of the bias current.

9. The method of claim 8, wherein each of the plurality of SQUIDs comprises a Josephson junction, a first inductor arranged opposite the Josephson junction, and a second inductor, wherein the RF SQUIDs are arranged in an alternating pattern with respect to the respective Josephson junction and the respective first inductor, and wherein the second inductor interconnects the respective one of the RF SQUIDs and a previous one of the RF SQUIDs in the array to provide flux to the respective one of the RF SQUIDs and the previous one of the RF SQUIDs in response to the input currents.

10. The method of claim 8, wherein the inductive coupler is coupled to the current control element via at least one of a first terminal and a second terminal associated with the current control element, wherein the SQUID array is arranged as a first array of RF SQUIDs and a second array of RF SQUIDs arranged in parallel between a first terminal and a second terminal of the SQUID array.

11. The method of claim 8, wherein providing the bias current comprises providing the bias current to a transformer associated with the current control element to induce a flux in each of the RF SQUIDs of the SQUID array to control the amplitude of the load current.

12. A superconducting current control system comprising:

an inductive coupler comprising a load inductor and a control inductor, the inductive coupler being configured to inductively provide a control current from the control inductor to a superconducting circuit device based on a load current being provided through the load inductor as a first portion of an input current that is received at an input of the superconducting current control system;

a current control element arranged in series with the load inductor and comprising a first superconducting quantum interference device (SQUID) array and a second SQUID array arranged in parallel between a first terminal and a second terminal, each of the first and second SQUID array comprising a plurality of RF SQUIDs; and a shunt inductor in parallel with the series arrangement of the current control element and the load inductor to conduct a second portion of the input current, the current control element being configured as a tunable inductive path for the first portion of the input current via at least one of the first and second terminals to control an amplitude of the first portion of the input current as the load current through the load inductor based on an amplitude of a bias current provided to the current control element, the control current having an amplitude that is based on the amplitude of the load current.

13. The system of claim 12, wherein each of the plurality of SQUIDs comprises a Josephson junction, a first inductor arranged opposite the Josephson junction, and a second inductor, wherein the RF SQUIDs are arranged in an alternating pattern with respect to the respective Josephson junction and the respective first inductor, and wherein the second inductor interconnects the respective one of the RF SQUIDs and a previous one of the RF SQUIDs in the array to provide flux to the respective one of the RF SQUIDs and the previous one of the RF SQUIDs in response to the input currents.

* * * * *